(12) United States Patent
Wakaki et al.

(10) Patent No.: US 10,270,411 B2
(45) Date of Patent: Apr. 23, 2019

(54) AMPLIFIER

(71) Applicant: Murata Manufacturing Co., Ltd., Kyoto (JP)

(72) Inventors: Ken Wakaki, Kyoto (JP); Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/618,446

(22) Filed: Jun. 9, 2017

(65) Prior Publication Data

US 2017/0359046 A1 Dec. 14, 2017

(30) Foreign Application Priority Data

Jun. 10, 2016 (JP) ................................. 2016-116301

(51) Int. Cl.
| | |
|---|---|
| H03F 3/04 | (2006.01) |
| H03G 3/30 | (2006.01) |
| H03F 1/22 | (2006.01) |
| H03F 1/56 | (2006.01) |
| H03G 1/00 | (2006.01) |
| H03F 3/193 | (2006.01) |

(52) U.S. Cl.
CPC .......... *H03G 3/3042* (2013.01); *H03F 1/223* (2013.01); *H03F 1/56* (2013.01); *H03F 3/193* (2013.01); *H03G 1/0023* (2013.01); *H03G 1/0035* (2013.01); *H03G 1/0088* (2013.01); *H03F 2200/222* (2013.01); *H03F 2200/294* (2013.01); *H03F 2200/318* (2013.01); *H03F 2200/387* (2013.01); *H03F 2200/451* (2013.01); *H03F 2200/61* (2013.01); *H03G 3/3052* (2013.01); *H03G 2201/106* (2013.01)

(58) Field of Classification Search
CPC ....... H03F 1/22; H03F 1/223; H03F 2200/294
USPC .......................... 330/51, 311, 284, 285, 296
See application file for complete search history.

(56) References Cited

U.S. PATENT DOCUMENTS

| | | | |
|---|---|---|---|
| 8,686,796 B2* | 4/2014 | Presti ...................... | H03F 1/223 330/302 |
| 2009/0167440 A1* | 7/2009 | Reis ........................ | H03F 1/223 330/311 |
| 2013/0314164 A1* | 11/2013 | Din ........................ | H03F 1/0205 330/296 |

FOREIGN PATENT DOCUMENTS

JP 2002-009564 A 1/2002

* cited by examiner

*Primary Examiner* — Khanh V Nguyen
*Assistant Examiner* — Khiem D Nguyen
(74) *Attorney, Agent, or Firm* — Pearne & Gordon LLP

(57) ABSTRACT

An amplifier according to an embodiment of the present invention includes a first transistor and a second transistor that are connected between a ground point and a power supply. A control terminal of the first transistor is connected to an input terminal. A first terminal of the first transistor is connected to the ground point. A second terminal of the second transistor is connected to an output terminal. The amplifier further includes an impedance element and a variable resistance unit. The impedance element is connected between the second terminal of the second transistor and the power supply. The variable resistance unit is connected between the second terminal of the first transistor and the first terminal of the second transistor.

19 Claims, 16 Drawing Sheets

// AMPLIFIER

This application claims priority of Japanese Patent Application No. 2016-116301 filed on Jun. 10, 2016. The contents of this application are incorporated herein by reference in its entirety.

BACKGROUND

The present invention relates to an amplifier. Amplifiers that use transistors are known in the art. For example, Japanese Unexamined Patent Application Publication No. 2002-9564 discloses a variable gain device including a cascode amplifier circuit, an input matching circuit, and an output matching circuit. The cascode amplifier circuit includes a common-source first field effect transistor and a second field effect transistor. The source of the second field effect transistor is connected to the drain of the first field effect transistor, and the gate of the second field effect transistor is supplied with a gain control signal. The input matching circuit is connected between an input terminal for a high-frequency input signal and the gate of the first field effect transistor and can provide impedance that maximizes gain. The output matching circuit is connected between the drain of the second field effect transistor and an output terminal for a high-frequency output signal and sets the impedance seen from the drain of the second field effect transistor to a value that makes the phase deviation of a passing high-frequency signal substantially constant over a variable voltage range of the gain control signal. The disclosed variable gain device can keep the deviation of the passing phase substantially constant over a variable gain range. The disclosed variable gain device is low in power consumption, easy to reduce in size, and suitable for use in an IC.

The gain of an amplifier needs to be adjusted in accordance with the level of the signal to be input and it is desirable to linearly adjust the gain.

In the variable gain device disclosed in Japanese Unexamined Patent Application Publication No. 2002-9564, the gain is controlled in accordance with the voltage value of the gain control signal applied to the gate of the second field effect transistor. However, the range of voltage values of the gain control signal over which the gain can be controlled is limited to a linear area within which the current flowing through the second field effect transistor changes. For a voltage value that falls out of the linear area, the gain is not controllable. Therefore, in the variable gain device disclosed in Japanese Unexamined Patent Application Publication No. 2002-9564, if the voltage applied to the second field effect transistor falls below a certain value, the gain decreases excessively. As a result, it is difficult to finely adjust the attenuation of the gain.

BRIEF SUMMARY

Accordingly, the present disclosure provides an amplifier whose gain can be controlled so as to be close to a desired value.

According to embodiments of the present disclosure, an amplifier amplifies a signal input to an input terminal thereof and outputs the amplified signal from an output terminal thereof. The amplifier includes a first transistor and a second transistor that are connected between a ground point and a power supply. Each of the first transistor and the second transistor includes a control terminal, a first terminal, and a second terminal. The control terminal of the first transistor is connected to the input terminal. The first terminal of the first transistor is connected to the ground point. The second terminal of the second transistor is connected to the output terminal. The amplifier further includes an impedance element and a variable resistance unit. The impedance element is connected between the second terminal of the second transistor and the power supply. The variable resistance unit is connected between the second terminal of the first transistor and the first terminal of the second transistor.

In an amplifier according to embodiments of the present disclosure, the gain can be controlled so as to be close to a desired value by causing the resistance value of the variable resistance unit to vary.

Other features, elements, characteristics and advantages of the present disclosure will become more apparent from the following detailed description of embodiments of the present disclosure with reference to the attached drawings.

DETAILED DESCRIPTION

Figure 1:
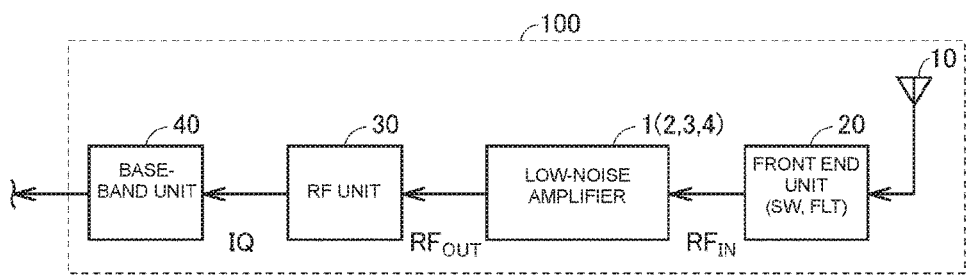
FIG. 1 is a functional block diagram illustrating an example functional configuration of a receiving unit that includes a low-noise amplifier which is an amplifier according to a first embodiment.

Embodiments of the present disclosure will be described in detail hereinafter with reference to the drawings. In the drawings, the same or similar portions are assigned the same numerals and are not basically described again.

First Embodiment

FIG. 1 is a functional block diagram depicting a functional configuration of a receiving unit 100 that includes a low-noise amplifier (LNA) as an amplifier according to a first embodiment.

As illustrated in FIG. 1, the receiving unit 100 includes an antenna 10, a front end unit 20, a low-noise amplifier 1, a radio-frequency (RF) unit 30, and a baseband unit 40.

The antenna 10 receives an RF signal transmitted from a base station and outputs the RF signal to the front end unit 20.

The front end unit 20 includes a switch (SW) and a filter (FLT) and performs filtering on the RF signal from the antenna 10 or switching between the RF signal and a transmit signal to be transmitted to the base station. The front end unit 20 outputs the RF signal to the low-noise amplifier 1. The front end unit 20 is controlled by an external controller (not illustrated).

The low-noise amplifier 1 amplifies the power of the RF signal output from the front end unit 20 to a level such that the RF signal can be demodulated by the RF unit 30 and outputs the resulting signal to the RF unit 30.

The RF unit 30 generates an in-phase/quadrature (IQ) signal from the RF signal output from the low-noise amplifier 1. The IQ signal is, for example, a signal of about several megahertz (MHz) to several tens of megahertz (MHz). The RF unit 30 may be configured to, instead of converting the RF signal directly into the IQ signal, convert the RF signal into an intermediate frequency (IF) signal and then generate the IQ signal from the IF signal.

The baseband unit 40 demodulates the IQ signal and outputs a signal as audio or data to an external circuit.

In the low-noise amplifier 1, a plurality of field effect transistors (FETs) is connected in cascode to achieve the desired gain. One method for controlling the gain of the low-noise amplifier 1 may be a method for controlling the gain by varying the voltage value of a control signal applied to the gate of one of the field effect transistors. However, the range of voltage values of the control signal over which the gain can be controlled is limited to a linear area within which the current flowing through the field effect transistor changes. For a voltage value that falls out of the linear area, the gain is not controllable. According to a method for controlling the gain by varying the voltage value of the control signal applied to the gate of a field effect transistor, therefore, if the voltage applied to the gate of the field effect transistor falls below a certain value, the gain decreases excessively and it is difficult to finely adjust the attenuation of the gain.

In the first embodiment, accordingly, a variable resistance unit is connected between two cascode-connected transistors to make the resistance from an input terminal to an output terminal vary. This configuration can control the current flowing through a plurality of cascode-connected transistors without necessarily any limitation on linear areas of the field effect transistors and can adjust the extent of voltage drop relative to the power supply voltage at an output terminal of the low-noise amplifier. Consequently, the gain of the low-noise amplifier can be controlled so as to be close to a desired value.

Figure 2:
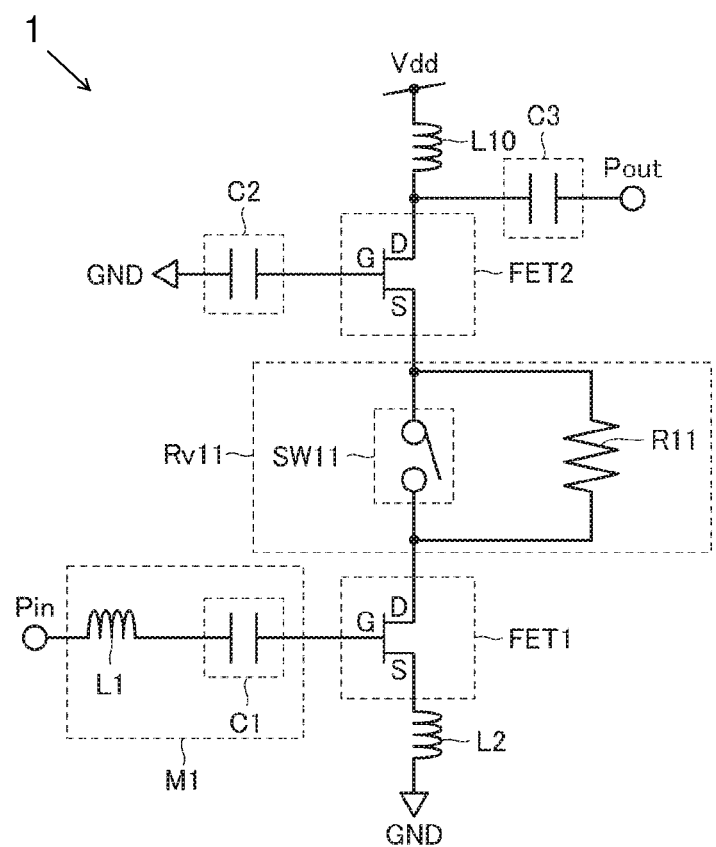
FIG. 2 is a circuit diagram of a low-noise amplifier that is an example of the amplifier according to the first embodiment.

FIG. 2 is a circuit diagram of the low-noise amplifier 1, which is an example of the amplifier according to the first embodiment. As illustrated in FIG. 2, the low-noise amplifier 1 includes an input terminal Pin, an output terminal Pout, a first transistor FET1, a second transistor FET2, an inductor L10, a variable resistance unit Rv11, a first matching circuit M1, an inductor L2, a capacitor C2, and a capacitor C3.

The first transistor FET1 is a field effect transistor. The first transistor FET1 is connected between ground GND, which is a ground point, and a power supply Vdd. The first transistor FET1 includes a gate (G) as a control terminal, a source (S) as a first terminal, and a drain (D) as a second terminal. The gate of the first transistor FET1 is connected to the input terminal Pin. The source of the first transistor FET1 is connected to the ground GND.

The second transistor FET2 is a field effect transistor. The second transistor FET2 is connected between the ground GND, which is a ground point, and the power supply Vdd. The second transistor FET2 includes a gate (G) as a control terminal, a source (S) as a first terminal, and a drain (D) as a second terminal. The capacitor C2 is connected between the gate of the second transistor FET2 and the ground GND. The capacitor C2 is used to connect the gate of the second transistor FET2 to RF ground. The voltage applied to the gate of the second transistor FET2 may not be constant, but may be variable. The drain of the second transistor FET2 is connected to the output terminal Pout.

The inductor L10 is connected between the drain of the second transistor FET2 and the power supply Vdd. The inductor L10 is configured such that the power supply Vdd is disconnected in terms of RF signals in order to prevent a signal amplified by the first transistor FET1 and the second transistor FET2 from being returned to the power supply Vdd.

The first matching circuit M1 is connected between the input terminal Pin and the gate of the first transistor FET1. The first matching circuit M1 includes, for instance, an inductor L1 and a capacitor C1. The inductor L1 and the capacitor C1 are connected in series in this order from the input terminal Pin to the gate of the first transistor FET1. The first matching circuit M1 is not limited to the structure or configuration illustrated in FIG. 2 and may include any other element or circuit configuration.

The inductor L2 is connected between the source of the first transistor FET1 and the ground GND. The inductor L2 corresponds to a second matching circuit in the present disclosure. The second matching circuit may include an element other than the inductor L2.

The capacitor C3 is connected between the drain of the second transistor FET2 and the output terminal Pout. The capacitor C3 corresponds to a third matching circuit in the present disclosure. The third matching circuit may include an element other than the capacitor C3.

The first matching circuit M1 matches the input impedance of the first transistor FET1 to the impedance of the input terminal Pin. The capacitor C3 prevents a direct-current (DC) voltage from being output to the output terminal Pout and matches the output impedance of the second transistor FET2 to the impedance of the output terminal Pout.

The variable resistance unit Rv11 is connected between the drain of the first transistor FET1 and the source of the second transistor FET2. The variable resistance unit Rv11 includes a first switch SW11 and a first resistor R11. The first switch SW11 is connected between the drain of the first transistor FET1 and the source of the second transistor FET2. The first resistor R11 is connected in parallel with the first switch SW11. Switching between the closed and open states of the first switch SW11 enables the resistance value of the variable resistance unit Rv11 to vary in a discrete manner. In the first embodiment, the resistance value of the variable resistance unit Rv11 can be made to vary in two stages.

The resistance value of the variable resistance unit Rv11 is smaller when the first switch SW11 is in the closed position than when the first switch SW11 is in the open position. The current flowing from the power supply Vdd to the ground GND through the second transistor FET2 and the first transistor FET1 is greater when the first switch SW11 is in the closed position than when the first switch SW11 is in the open position. The voltage drop across the drain of the second transistor FET2 from the voltage of the power supply Vdd is greater when the first switch SW11 is in the closed position than when the first switch SW11 is in the open position. Thus, when the power of the signal input to the input terminal Pin is changed, the extent of changes in the power at the drain of the second transistor FET2 connected to the output terminal Pout is larger when the first switch SW11 is in the closed position than when the first switch SW11 is in the open position. The gain of the low-noise amplifier 1 increases as the extent of changes in the power at the output terminal Pout when the power of the signal input to the input terminal Pin changes increases. Accordingly, the gain is greater when the first switch SW11 is in the closed position than when the first switch SW11 is in the open position. That is, the gain of the low-noise amplifier 1 can be increased as the resistance value of the variable resistance unit Rv11 is decreased.

In the first embodiment, the first transistor FET1 and the second transistor FET2 are connected in cascode between the input terminal Pin and the output terminal Pout via the variable resistance unit Rv11. That is, the drain, or second terminal, of the first transistor FET1 and the source, or first terminal, of the second transistor FET2 are connected to each other via the variable resistance unit Rv11. The size of the second transistor FET2 can be adjusted to adjust the characteristics. For example, the second transistor FET2 has a larger size than the first transistor FET1, which makes it possible to increase the gain of the low-noise amplifier 1 while suppressing the noise figure (NF).

Figure 3:
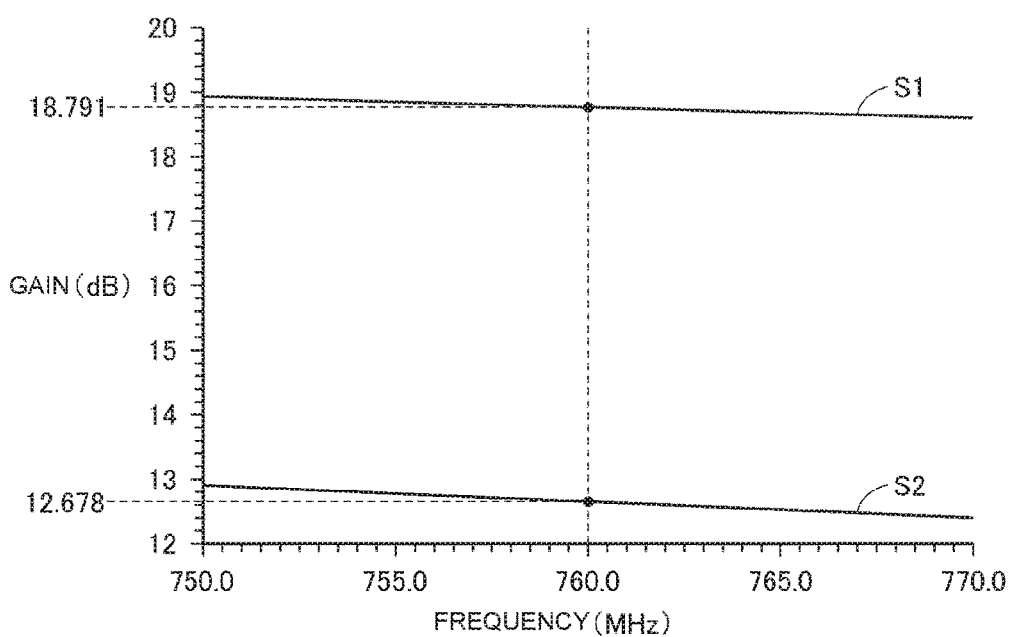
FIG. 3 is a diagram illustrating simulation results regarding a change in the gain of the low-noise amplifier.

FIG. 3 is a diagram illustrating simulation results regarding a change in the gain of the low-noise amplifier 1. In FIG. 3, the line S1 indicates a change in gain when the first switch SW11 is in the closed position. The line S2 indicates the gain when the first switch SW11 is in the open position. In FIG. 3, simulation results obtained when the first resistor R11 is 50Ω are illustrated.

As illustrated in FIG. 3, as a result of comparison of the gain at a particular frequency when the first switch SW11 is in the closed position and when the first switch SW11 is in the open position, the gain is greater when the first switch SW11 is in the closed position. For example, a gain of 18.791 dB is obtained at a frequency of 760 MHz when the first switch SW11 is in the closed position. On the other hand, when the first switch SW11 is in the open position, a gain of 12.678 dB is obtained at a frequency of 760 MHz. Accordingly, the gain is greater when the first switch SW11 is in the closed position. That is, switching between the closed and open states of the first switch SW11 enables the gain of the low-noise amplifier 1 to vary in a discrete manner. Consequently, the gain can be controlled so as to be close to a desired gain.

As described above, according to the first embodiment, the resistance value of a variable resistance unit is made to vary, thereby enabling gain to be controlled so that the gain becomes close to a desired value without necessarily any limitation on a linear area of a transistor.

According to the first embodiment, furthermore, the variable resistance unit is implementable by a switch and a resistor. This configuration eliminates the need for a circuit for adjusting the voltage applied to the control terminal of the transistor and can realize a reduction in circuit size. In addition, switching between the closed and open states of the switch enables gain control, which makes it easier to control gain than when the voltage applied to the control terminal of the transistor is controlled.

First Modification of First Embodiment

In the first embodiment, reference has been made to the case where two transistors are connected in cascode. More than two transistors may be connected in cascode. In a first modification of the first embodiment, the case where three transistors are connected in cascode will be described.

The first modification of the first embodiment is different from the first embodiment in that a third transistor and a variable resistance unit are connected between the variable resistance unit Rv11 and the second transistor FET2. Other configurations are similar to those in the first embodiment and are not described repeatedly herein.

Figure 4:
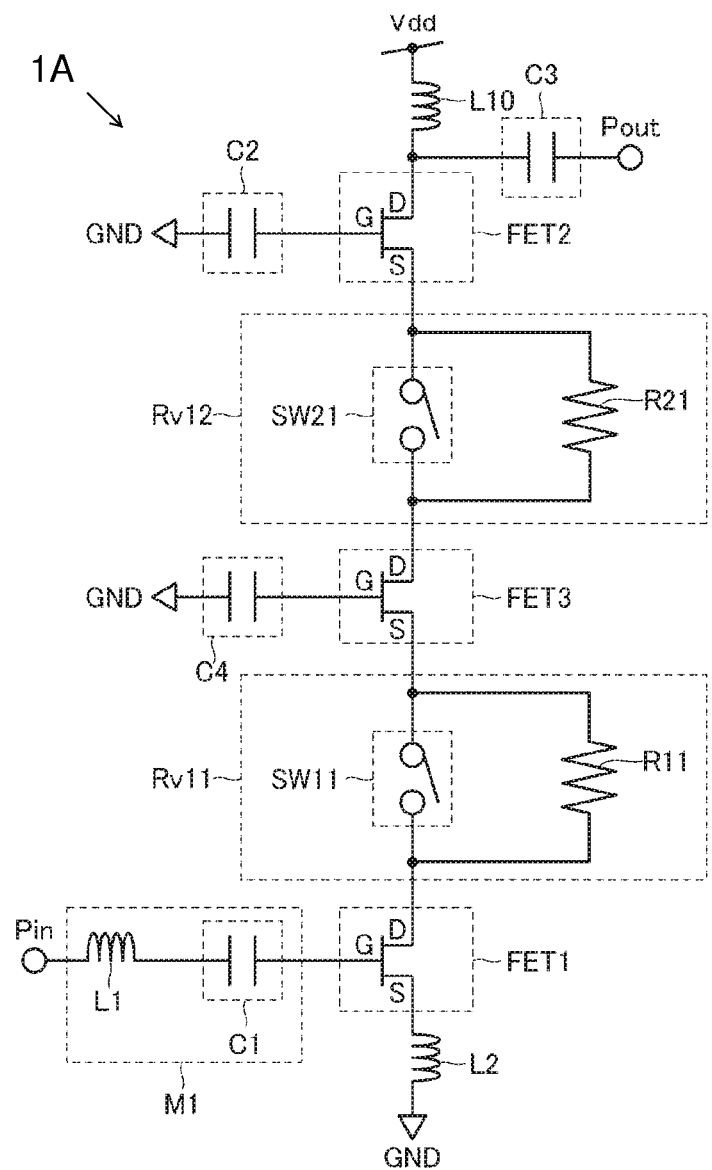
FIG. 4 is a circuit diagram of a low-noise amplifier that is an example of an amplifier according to a first modification of the first embodiment.

FIG. 4 is a circuit diagram of a low-noise amplifier 1A that is an example of an amplifier according to the first modification of the first embodiment. As illustrated in FIG. 4, the low-noise amplifier 1A further includes a third transistor FET3 and a variable resistance unit Rv12.

The third transistor FET3 is a field effect transistor. The third transistor FET3 includes a gate (G) as a control terminal, a source (S) as a first terminal, and a drain (D) as a second terminal. A capacitor C4 is connected between the gate of the third transistor FET3 and the ground GND. The capacitor C4 is used to connect the gate of the third transistor FET3 to RF ground. The voltage applied to the gate of the third transistor FET3 may not be constant, but may be variable. In the first modification of the first embodiment, the first switch SW11 is connected between the drain of the first transistor FET1 and the source of the third transistor FET3.

The variable resistance unit Rv12 is connected between the source of the second transistor FET2 and the drain of the third transistor FET3. The variable resistance unit Rv12 includes a first switch SW21 and a first resistor R21. The first switch SW21 is connected between the drain of the third transistor FET3 and the source of the second transistor FET2. The first resistor R21 is connected in parallel with the first switch SW21. Switching between the closed and open states of the first switch SW21 enables the resistance value of the variable resistance unit Rv12 to vary in a discrete manner.

In the first modification of the first embodiment, the first transistor FET1, the third transistor FET3, and the second transistor FET2 are connected in cascode between the input terminal Pin and the output terminal Pout via the variable resistance units Rv11 and Rv12. That is, the drain, or second terminal, of the first transistor FET1 and the source, or first terminal, of the third transistor FET3 are connected to each other via the variable resistance unit Rv11. The drain, or second terminal, of the third transistor FET3 and the source, or first terminal, of the second transistor FET2 are connected to each other via the variable resistance unit Rv12.

The third transistor FET3 can have a larger size than the second transistor FET2, and the size of the second transistor FET2 can have a larger size than the first transistor FET1. As a result, the third transistor FET3 can have a larger size than the first transistor FET1. Accordingly, a transistor closer to the output terminal Pout among a plurality of cascode-connected transistors has a larger size, which makes it possible to increase the gain of the low-noise amplifier 1A while suppressing the noise figure (NF). This holds true for when a low-noise amplifier includes four or more cascode-connected transistors.

As described above, also according to the first modification of the first embodiment, the resistance values of variable resistance units are made to vary, thereby enabling gain to be controlled so as to be close to a desired value without necessarily any limitation on a linear area of a transistor. In addition, also in the first modification of the first embodiment, the variable resistance units are each implementable by a switch and a resistor. This configuration eliminates the need for a circuit for adjusting the voltage applied to the control terminal of the transistor and can realize a reduction in circuit size. Additionally, switching between the closed and open states of the switches enables gain control, which makes it easier to control gain than when the voltage applied to the control terminal of the transistor is controlled.

In the first modification of the first embodiment, switching between the closed and open states of the first switches SW11 and SW21 enables the resistance values of the variable resistance units to vary in four stages. In the first modification of the first embodiment, therefore, it is possible to adjust gain in finer increments than in the first embodiment.

In the first modification of the first embodiment, furthermore, the number of cascode-connected transistors is larger than that in the first embodiment. As the number of cascode-connected transistors increases, the voltage withstanding capability of the low-noise amplifier increases and the voltage of the power supply Vdd can be set higher. Accordingly, the gain of the low-noise amplifier can be increased. In the first modification of the first embodiment in which three cascode-connected transistors are used, therefore, the gain can be increased, compared with the first embodiment in which two cascode-connected transistors are used, and, furthermore, gain adjustment can be carried out.

Second Modification of First Embodiment

In the first modification of the first embodiment, reference has been made to the case where variable resistance units are connected between cascode-connected transistors. Variable resistance units may not necessarily be connected between cascode-connected transistors. It is sufficient that at least one variable resistance unit be connected between the first transistor FET1 whose gate is connected to the input terminal Pin and the second transistor FET2 whose drain is connected to the output terminal Pout. For example, in a circuit diagram of a low-noise amplifier 1B illustrated in FIG. 5, the variable resistance unit Rv12 is connected between the second transistor FET2 and the third transistor FET3. However, no variable resistance unit is connected between the first transistor FET1 and the third transistor FET3. No variable resistance unit may be connected between the second transistor FET2 and the third transistor FET3, but a variable resistance unit may be connected between the first transistor FET1 and the third transistor FET3.

Also according to a second modification of the first embodiment, the resistance value of a variable resistance unit is made to vary, thereby enabling gain to be controlled so as to be close to a desired value without necessarily any limitation on a linear area of a transistor. In addition, also in the second modification of the first embodiment, the variable resistance unit is implementable by a switch and a resistor. This configuration eliminates the need for a circuit for adjusting the voltage applied to the control terminal of the transistor and can realize a reduction in circuit size. Additionally, switching between the closed and open states of the switch enables gain control, which makes it easier to control gain than when the voltage applied to the control terminal of the transistor is controlled.

In the second modification of the first embodiment, furthermore, the number of cascode-connected transistors is larger than that in the first embodiment. Thus, in the second modification of the first embodiment in which three cascode-connected transistors are used, gain adjustment can also be carried out.

Third Modification of First Embodiment

In the first embodiment and the first and second modifications, reference has been made to the case where transistors included in an amplifier according to an embodiment are field effect transistors. Transistors included in an amplifier according to an embodiment may be bipolar transistors. In the following, a description will be given of a third modification of the first embodiment in which transistors included in an amplifier according to an embodiment are bipolar transistors.

The third modification of the first embodiment is different from the first embodiment in that the first transistor and the second transistor are bipolar transistors instead of field effect transistors. That is, in the third modification of the first embodiment, the first transistor FET1 and the second transistor FET2 illustrated in FIG. 2 are replaced with a first transistor BPT1 and a second transistor BPT2 illustrated in FIG. 6, respectively. Other configurations are similar to those in the first embodiment and are not described repeatedly herein.

Figure 6:
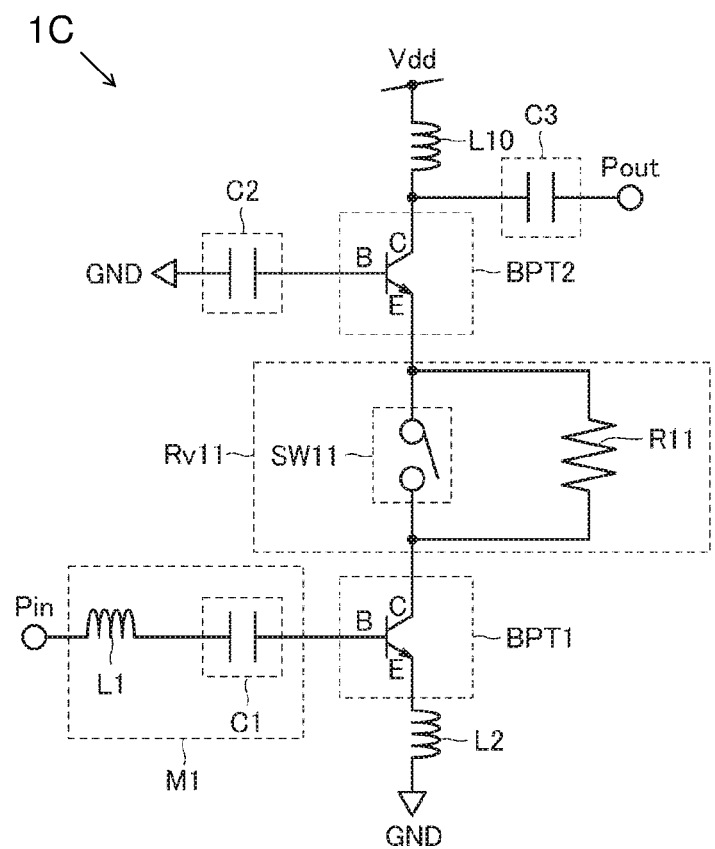
FIG. 6 is a circuit diagram of a low-noise amplifier that is an example of an amplifier according to a third modification of the first embodiment.

FIG. 6 is a circuit diagram of a low-noise amplifier 1C that is an example of an amplifier according to the third modification of the first embodiment. As illustrated in FIG. 6, the low-noise amplifier 1C includes the first transistor BPT1 and the second transistor BPT2.

The first transistor BPT1 is a bipolar transistor. The first transistor BPT1 is connected between the ground GND, which is a ground point, and the power supply Vdd. The first transistor BPT1 includes a base (B) as a control terminal, an emitter (E) as a first terminal, and a collector (C) as a second terminal. The base of the first transistor BPT1 is connected to the input terminal Pin. The emitter of the first transistor BPT1 is connected to the ground GND.

The second transistor BPT2 is a bipolar transistor. The second transistor BPT2 is connected between the ground GND and the power supply Vdd. The second transistor BPT2 includes a base (B) as a control terminal, an emitter (E) as a first terminal, and a collector (C) as a second terminal. The capacitor C2 is connected between the base of the second transistor BPT2 and the ground GND. The capacitor C2 is used to connect the base to RF ground. The voltage applied to the gate of the second transistor BPT2 may not be constant, but may be variable. The collector of the second transistor BPT2 is connected to the output terminal Pout.

The variable resistance unit Rv11 is connected between the collector of the first transistor BPT1 and the emitter of the second transistor BPT2.

As described above, also according to the third modification of the first embodiment, the resistance value of a variable resistance unit is made to vary, thereby enabling gain to be controlled so as to be close to a desired value without necessarily any limitation on a linear area of a transistor. In addition, also in the third modification of the first embodiment, the variable resistance unit is implementable by a switch and a resistor. This configuration eliminates the need for a circuit for adjusting the voltage applied to the control terminal of the transistor and can realize a reduction in circuit size. Additionally, switching between the closed and open states of the switch enables gain control, which makes it easier to control gain than when the voltage applied to the control terminal of the transistor is controlled.

Second Embodiment

In the first embodiment, reference has been made to the case where the resistance value of a variable resistance unit is made variable in two stages. The number of stages in which the resistance value of a variable resistance unit varies is not limited to two and the resistance value of a variable resistance unit may vary in three or more multiple stages. In a second embodiment, a description will be given of a case where the resistance value of a variable resistance unit is made variable in three or more multiple stages.

The second embodiment is different from the first embodiment in that the resistance value of a variable resistance unit is made variable in three or more stages. Other configurations are similar and are not described repeatedly herein.

Figure 7:
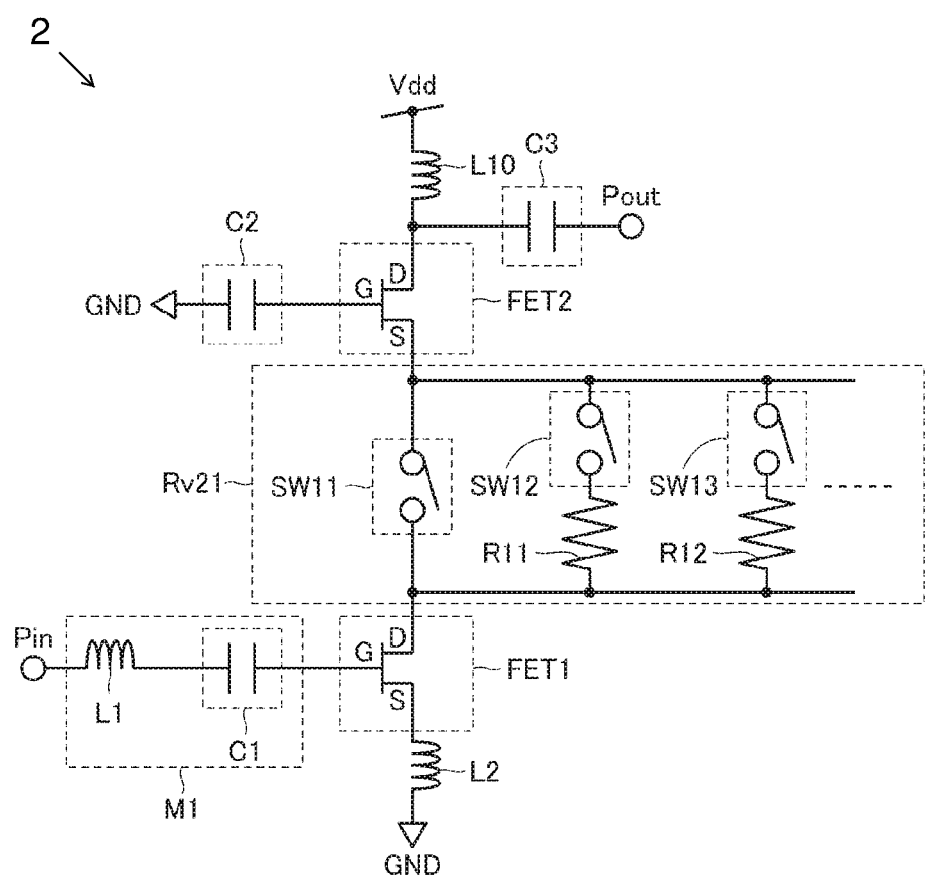
FIG. 7 is a circuit diagram of a low-noise amplifier that is an example of an amplifier according to a second embodiment.

FIG. 7 is a circuit diagram of a low-noise amplifier 2 that is an example of an amplifier according to the second embodiment. As illustrated in FIG. 7, the low-noise amplifier 2 includes a variable resistance unit Rv21.

The variable resistance unit Rv21 includes the first switch SW11 connected between the drain of the first transistor FET1 and the source of the second transistor FET2, the first resistor R11, a second switch SW12 connected in series with the first resistor R11, a second resistor R12, and a third switch SW13 connected in series with the second resistor R12. The first resistor R11 and the second switch SW12, which are connected in series, are connected in parallel with the first switch SW11. The second resistor R12 and the third switch SW13, which are connected in series, are connected in parallel with the first switch SW11. In the variable resistance unit Rv21, a resistor and a switch that are connected in series may further be connected in parallel with the first switch SW11.

Switching between the closed and open states of the first switch SW11, the second switch SW12, and the third switch SW13 enables the resistance value of the variable resistance unit Rv12 to vary in a discrete manner. In the second embodiment, the resistance value of the variable resistance unit Rv12 can be made to vary in three or more stages.

As described above, according to the second embodiment, the resistance value of a variable resistance unit is made to vary, thereby enabling gain to be controlled so as to be close to a desired value without necessarily any limitation on a linear area of a transistor. In addition, also in the second embodiment, the variable resistance unit is implementable by switches and resistors. This configuration eliminates the need for a circuit for adjusting the voltage applied to the control terminal of the transistor and can realize a reduction in circuit size. Additionally, switching between the closed and open states of the switches enables gain control, which makes it easier to control gain than when the voltage applied to the control terminal of the transistor is controlled.

According to the second embodiment, the resistance value of the variable resistance unit can be made to vary in more stages than in the first embodiment. Thus, it is possible to adjust gain in finer increments than in the first embodiment.

First Modification of Second Embodiment

Similarly to the first modification of the first embodiment, the second embodiment can also provide a first modification in which three or more cascode-connected transistors are used. The first modification of the second embodiment is different from the first modification of the first embodiment in that the resistance value of a variable resistance unit is made variable in three or more stages. That is, in the first modification of the second embodiment, the variable resistance units Rv11 and Rv12 illustrated in FIG. 4 are replaced with variable resistance units Rv21 and Rv22 illustrated in FIG. 8, respectively. Other portions are similar and are not described repeatedly herein. The variable resistance unit Rv21 is similar to that in the second embodiment and is not described repeatedly herein.

Figure 8:
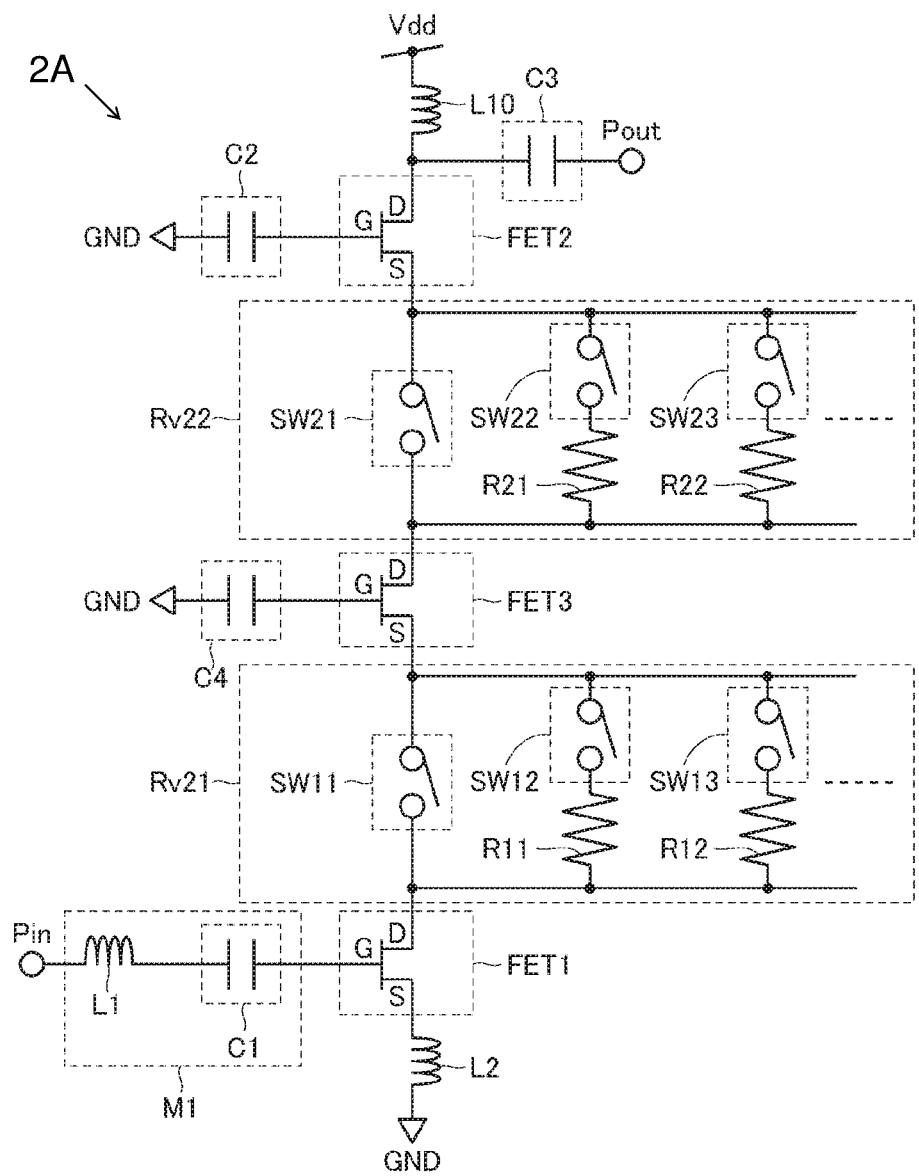
FIG. 8 is a circuit diagram of a low-noise amplifier that is an example of an amplifier according to a first modification of the second embodiment.

FIG. 8 is a circuit diagram of a low-noise amplifier 2A that is an example of an amplifier according to the first modification of the second embodiment. As illustrated in FIG. 8, the low-noise amplifier 2A includes the variable resistance unit Rv22.

The variable resistance unit Rv22 includes the first switch SW21 connected between the drain of the third transistor FET3 and the source of the second transistor FET2, the first resistor R21, a second switch SW22 connected in series with the first resistor R21, a second resistor R22, and a third switch SW23 connected in series with the second resistor R22. The first resistor R21 and the second switch SW22, which are connected in series, are connected in parallel with the first switch SW21. The second resistor R22 and the third switch SW23, which are connected in series, are connected in parallel with the first switch SW21. In the variable resistance unit Rv21, a resistor and a switch that are connected in series may further be connected in parallel with the first switch SW21.

Switching between the closed and open states of the first switch SW21, the second switch SW22, and the third switch SW23 enables the resistance value of the variable resistance unit Rv22 to vary in a discrete manner. In the first modification of the second embodiment, the resistance value of the variable resistance unit Rv22 can be made to vary in three or more stages.

The number of stages in which the resistance value of the variable resistance unit Rv21 is variable and the number of stages in which the resistance value of the variable resistance unit Rv22 is variable may be the same or different.

As described above, also according to the first modification of the second embodiment, the resistance values of variable resistance units are made to vary, thereby enabling gain to be controlled so as to be close to a desired value without necessarily any limitation on a linear area of a transistor. In addition, also in the first modification of the second embodiment, the variable resistance units are each implementable by switches and resistors. This configuration eliminates the need for a circuit for adjusting the voltage applied to the control terminal of the transistor and can realize a reduction in circuit size. Additionally, switching between the closed and open states of the switches enables gain control, which makes it easier to control gain than when the voltage applied to the control terminal of the transistor is controlled.

In the first modification of the second embodiment, switching between the closed and open states of the first switch SW11, the second switch SW12, the third switch SW13, the first switch SW21, the second switch SW22, and the third switch SW23 enables the resistance values of the variable resistance units to vary in three or more stages. Thus, according to the first modification of the second embodiment, it is possible to adjust gain in finer increments than in the first modification of the first embodiment.

Second Modification of Second Embodiment

Figure 5:
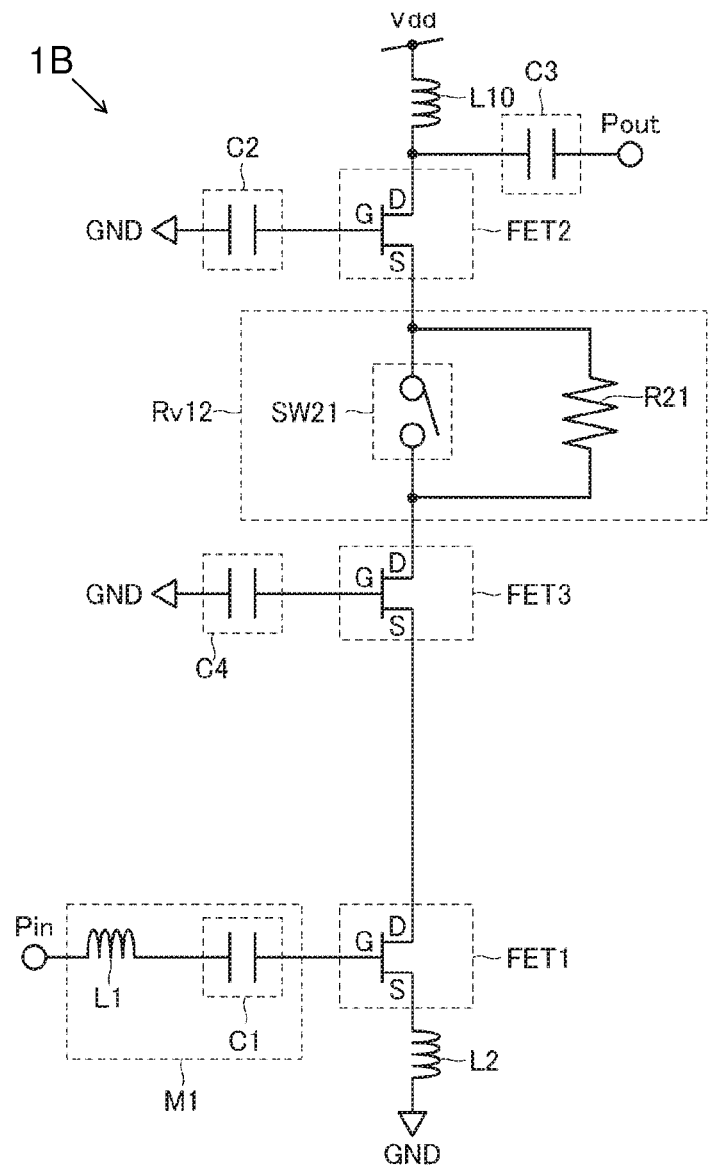
FIG. 5 is a circuit diagram of a low-noise amplifier that is an example of an amplifier according to a second modification of the first embodiment.

Similarly to the second modification of the first embodiment, the second embodiment can also provide a second modification in which a single variable resistance unit is connected between the first transistor FET1 connected to the input terminal Pin and the second transistor FET2 connected to the output terminal Pout. The second modification of the second embodiment is different from the second modification of the first embodiment in that the resistance value of a variable resistance unit is made variable in three or more stages. That is, in the second modification of the second embodiment, the variable resistance unit Rv12 illustrated in FIG. 5 is replaced with a variable resistance unit Rv22 illustrated in FIG. 9. Other portions are similar and are not described repeatedly herein. The variable resistance unit Rv22 is similar to that in the first modification of the second embodiment and is not described repeatedly herein.

Figure 9:
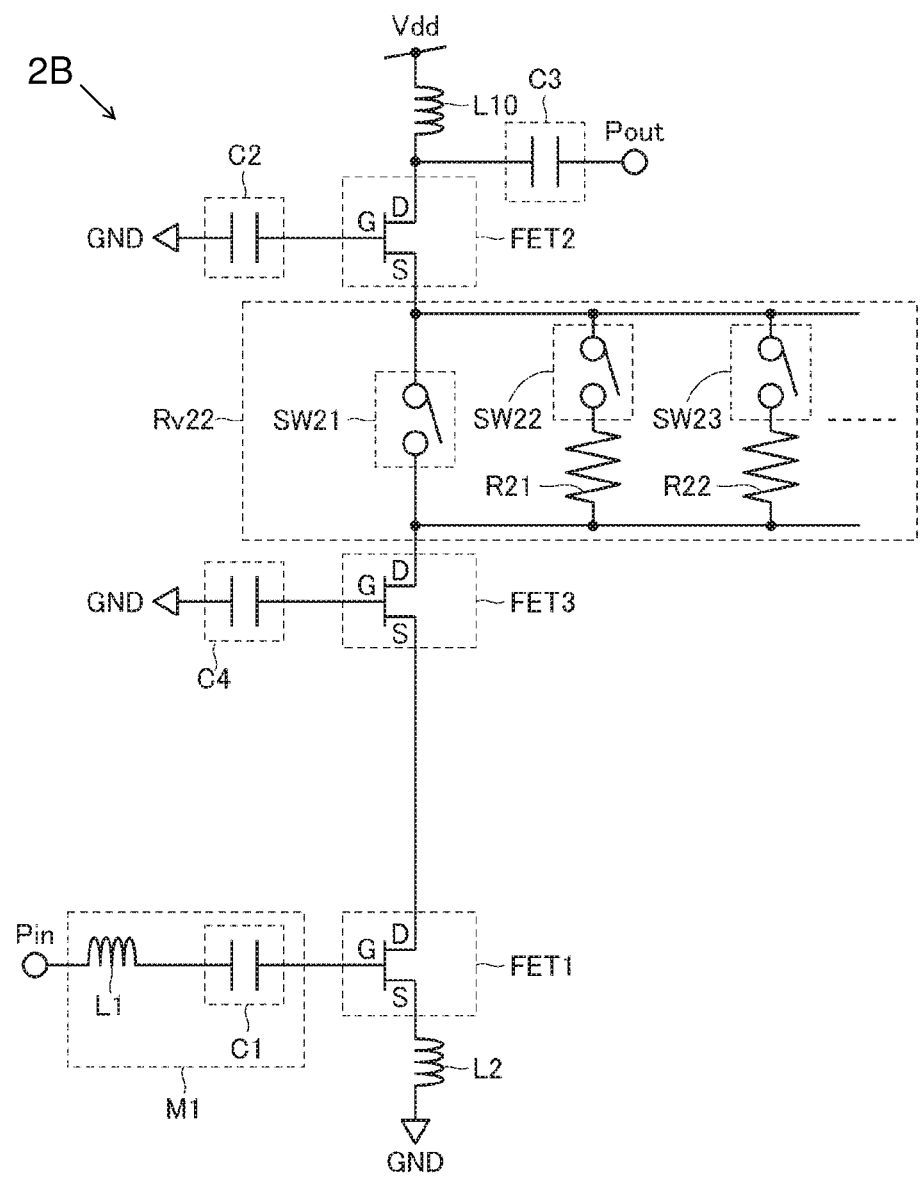
FIG. 9 is a circuit diagram of a low-noise amplifier that is an example of an amplifier according to a second modification of the second embodiment.

FIG. 9 is a circuit diagram of a low-noise amplifier 2B that is an example of an amplifier according to the second modification of the second embodiment. As illustrated in FIG. 9, the low-noise amplifier 2B includes the variable resistance unit Rv22. In the low-noise amplifier 2B, the variable resistance unit Rv22 is connected between the second transistor FET2 and the third transistor FET3. However, no variable resistance unit is connected between the first transistor FET1 and the third transistor FET3. No variable resistance unit may be connected between the second transistor FET2 and the third transistor FET3, but a variable resistance unit may be connected between the first transistor FET1 and the third transistor FET3.

As described above, also according to the second modification of the second embodiment, the resistance value of a variable resistance unit is made to vary, thereby enabling gain to be controlled so as to be close to a desired value without necessarily any limitation on a linear area of a transistor. In addition, also in the second modification of the second embodiment, the variable resistance unit is implementable by switches and resistors. This configuration eliminates the need for a circuit for adjusting the voltage applied to the control terminal of the transistor and can realize a reduction in circuit size. Additionally, switching between the closed and open states of the switches enables gain control, which makes it easier to control gain than when the voltage applied to the control terminal of the transistor is controlled.

In the second modification of the second embodiment, switching between the closed and open states of the first switch SW21, the second switch SW22, and the third switch SW23 enables the resistance value of the variable resistance unit to vary in at least three stages. Thus, according to the second modification of the second embodiment, it is possible to adjust gain in finer increments than in the second modification of the first embodiment.

Third Modification of Second Embodiment

Figure 10:
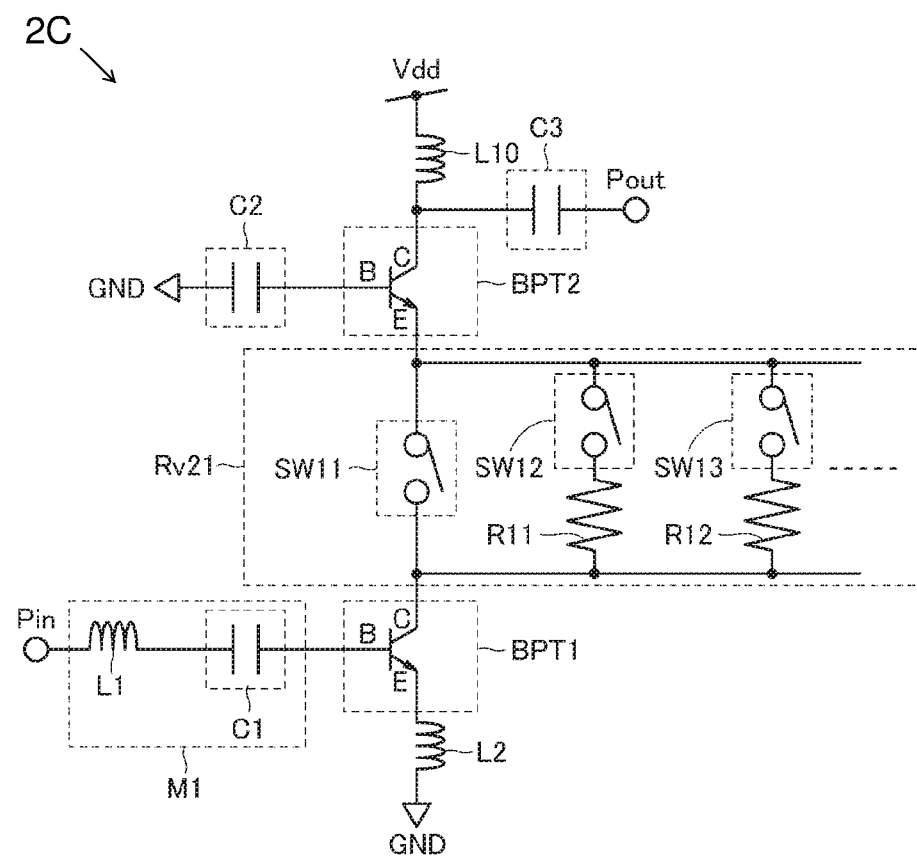
FIG. 10 is a circuit diagram of a low-noise amplifier that is an example of an amplifier according to a third modification of the second embodiment.

Similarly to the third modification of the first embodiment, the second embodiment can also provide a third modification in which transistors included in an amplifier according to an embodiment are bipolar transistors. The third modification of the second embodiment is different from the third modification of the first embodiment in that the resistance value of a variable resistance unit is made variable in three or more stages. That is, in the third modification of the second embodiment, the variable resistance unit Rv11 illustrated in FIG. 6 is replaced with a variable resistance unit Rv21 illustrated in FIG. 10. Other portions are similar and are not described repeatedly herein. The variable resistance unit Rv21 is similar to that in the second embodiment and is not described repeatedly herein.

Also according to the third modification of the second embodiment, the resistance value of a variable resistance unit is made to vary, thereby enabling gain to be controlled so as to be close to a desired value without necessarily any limitation on a linear area of a transistor. In addition, also in the third modification of the second embodiment, the variable resistance unit is implementable by switches and resistors. This configuration eliminates the need for a circuit for adjusting the voltage applied to the control terminal of the transistor and can realize a reduction in circuit size. Additionally, switching between the closed and open states of the switches enables gain control, which makes it easier to control gain than when the voltage applied to the control terminal of the transistor is controlled.

Also in the third modification of the second embodiment, the resistance value of the variable resistance unit can be made to vary in more stages than in the third modification of the first embodiment. Thus, it is possible to adjust gain in finer increments than in the third modification of the first embodiment.

Fourth Modification of Second Embodiment

In the second embodiment and the first to third modifications of the second embodiment, reference has been made to the case where the resistance value of a variable resistance unit included in an amplifier according to an embodiment is made variable in three or more stages. An amplifier according to an embodiment may include both a variable resistance unit whose resistance value is made variable in two stages and a variable resistance unit whose resistance value is made variable in three or more stages. In a fourth modification of the second embodiment, a description will be given of a case where an amplifier according to an embodiment includes both a variable resistance unit whose resistance value is made variable in two stages and a variable resistance unit whose resistance value is made variable in three or more stages.

The fourth modification of the second embodiment is different from the first modification of the second embodiment in that the resistance value of a variable resistance unit connected between the first transistor FET1 and the third transistor FET3 is made variable in two stages. That is, in the fourth modification of the second embodiment, the variable resistance unit Rv21 illustrated in FIG. 8 is replaced with a variable resistance unit Rv11 illustrated in FIG. 11. Other portions are similar and are not described repeatedly herein. The variable resistance unit Rv11 is similar to that in the first embodiment and is not described repeatedly herein.

Figure 11:
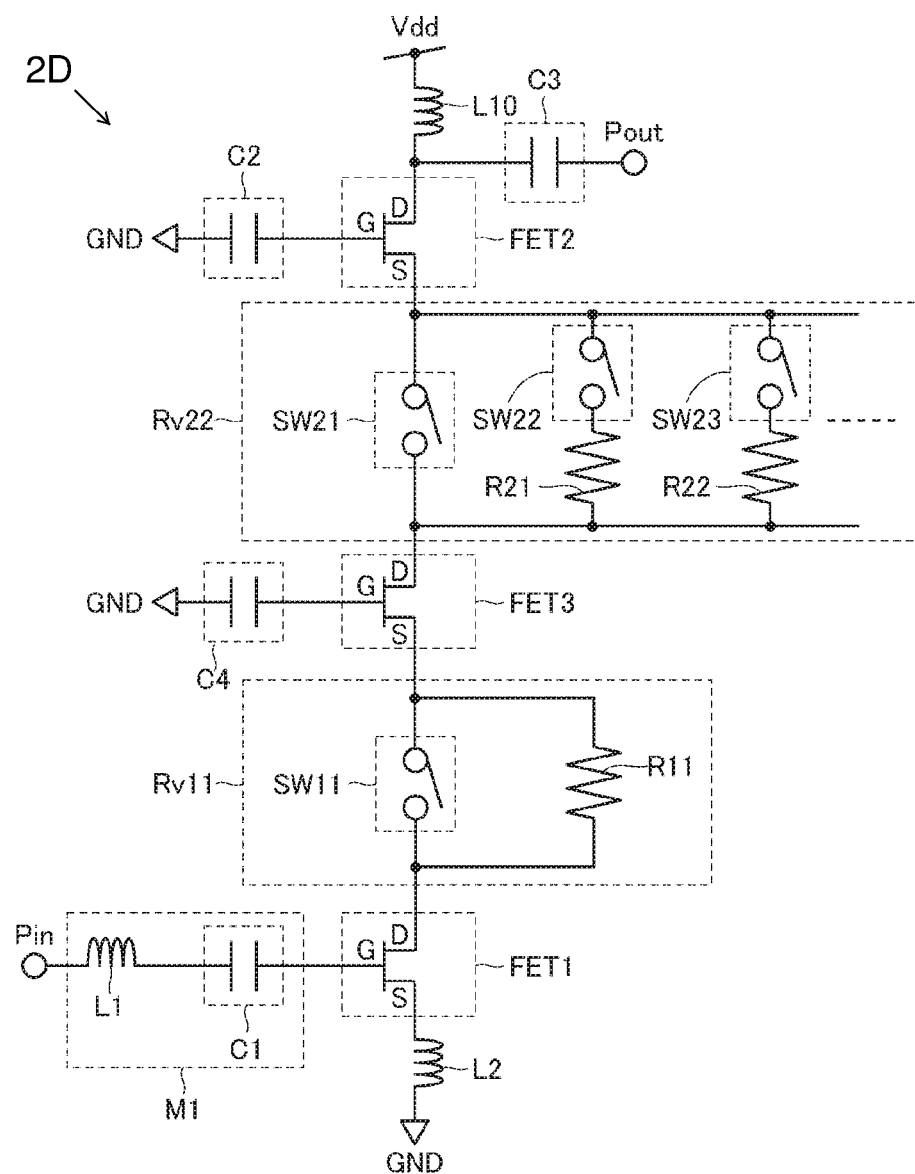
FIG. 11 is a circuit diagram of a low-noise amplifier that is an example of an amplifier according to a fourth modification of the second embodiment.

FIG. 11 is a circuit diagram of a low-noise amplifier 2D that is an example of an amplifier according to the fourth modification of the second embodiment. As illustrated in FIG. 11, in the fourth modification of the second embodiment, the resistance value of the variable resistance unit Rv11 connected between the first transistor FET1 and the third transistor FET3 is made variable in two stages, and the resistance value of the variable resistance unit Rv22 connected between the second transistor FET2 and the third transistor FET3 is made variable in three or more stages. The resistance value of a variable resistance unit connected between the first transistor FET1 and the third transistor FET3 may be made variable in three or more stages, and the resistance value of a variable resistance unit connected between the second transistor FET2 and the third transistor FET3 may be made variable in two stages.

As described above, also according to the fourth modification of the second embodiment, the resistance value of a variable resistance unit is made to vary, thereby enabling gain to be controlled so as to be close to a desired value without necessarily any limitation on a linear area of a transistor. In addition, also in the fourth modification of the second embodiment, the variable resistance unit is implementable by a switch and a resistor. This configuration eliminates the need for a circuit for adjusting the voltage applied to the control terminal of the transistor and can realize a reduction in circuit size. Additionally, switching between the closed and open states of the switch enables gain control, which makes it easier to control gain than when the voltage applied to the control terminal of the transistor is controlled.

In the fourth modification of the second embodiment, switching between the closed and open states of the first switch SW11, the first switch SW21, the second switch SW22, and the third switch SW23 enables the resistance values of variable resistance units to vary in three or more stages. Thus, according to the fourth modification of the second embodiment, it is possible to adjust gain in finer increments than in the first embodiment.

Third Embodiment

In the first and second embodiments, reference has been made to the case where the resistance value of a variable resistance unit connected between cascode-connected transistors is made variable in a discrete manner. The resistance value of a variable resistance unit connected between cascode-connected transistors may be made variable successively. In a third embodiment, a description will be given of a case where a variable resistance unit whose resistance value is made variable successively is connected between cascode-connected transistors.

The third embodiment is different from the first embodiment in that the resistance value of a variable resistance unit connected between cascode-connected transistors is made variable successively. That is, in the third embodiment, the variable resistance unit Rv11 illustrated in FIG. 2 is replaced with a variable resistance unit Rv3 illustrated in FIG. 12. Other portions are similar and are not described repeatedly herein.

Figure 12:
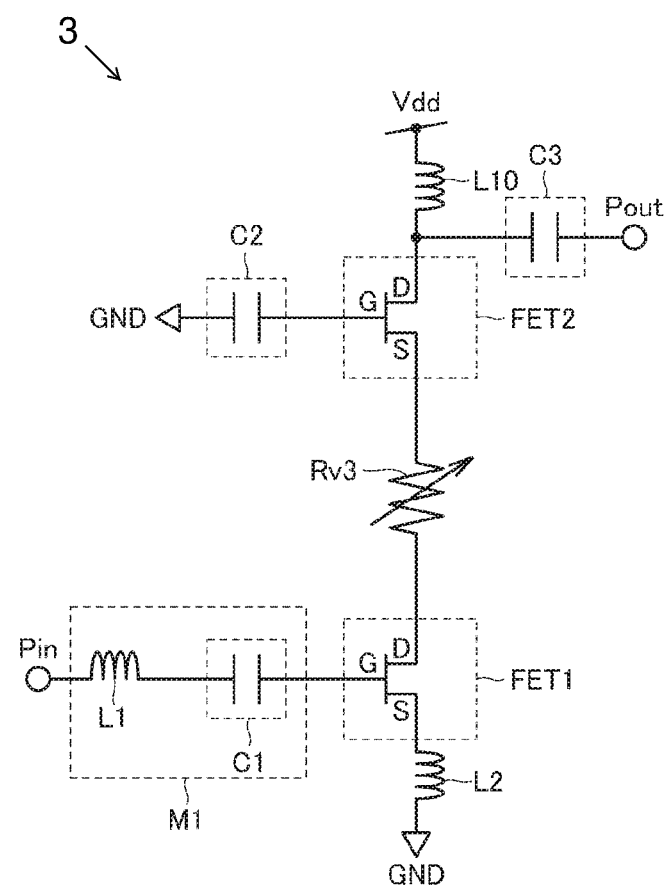
FIG. 12 is a circuit diagram of a low-noise amplifier that is an example of an amplifier according to a third embodiment.

FIG. 12 is a circuit diagram of a low-noise amplifier 3 that is an example of an amplifier according to the third embodiment. As illustrated in FIG. 12, the low-noise amplifier 3 includes the variable resistance unit Rv3.

The variable resistance unit Rv3 is connected between the drain of the first transistor FET1 and the source of the second transistor FET2. In the third embodiment, the resistance value of the variable resistance unit Rv3 is made variable successively.

As described above, according to the third embodiment, the resistance value of a variable resistance unit is made to vary, thereby enabling gain to be controlled so as to be close to a desired value without necessarily any limitation on a linear area of a transistor.

According to the third embodiment, furthermore, since the resistance value of the variable resistance unit is made variable successively, gain adjustment is more flexible than that in the first embodiment in which the resistance value of a variable resistance unit is made variable in a discrete manner.

Fourth Embodiment

In the first to third embodiments, reference has been made to the case where an amplifier according to an embodiment includes a plurality of transistors. An amplifier according to an embodiment may include a single transistor. In a fourth embodiment, a description will be given of a case where an amplifier according to an embodiment includes a single transistor.

The fourth embodiment is different from the first embodiment in that no transistor is connected between the variable resistance unit Rv11 and the inductor L10. Other configurations are similar and are not described repeatedly herein.

Figure 13:
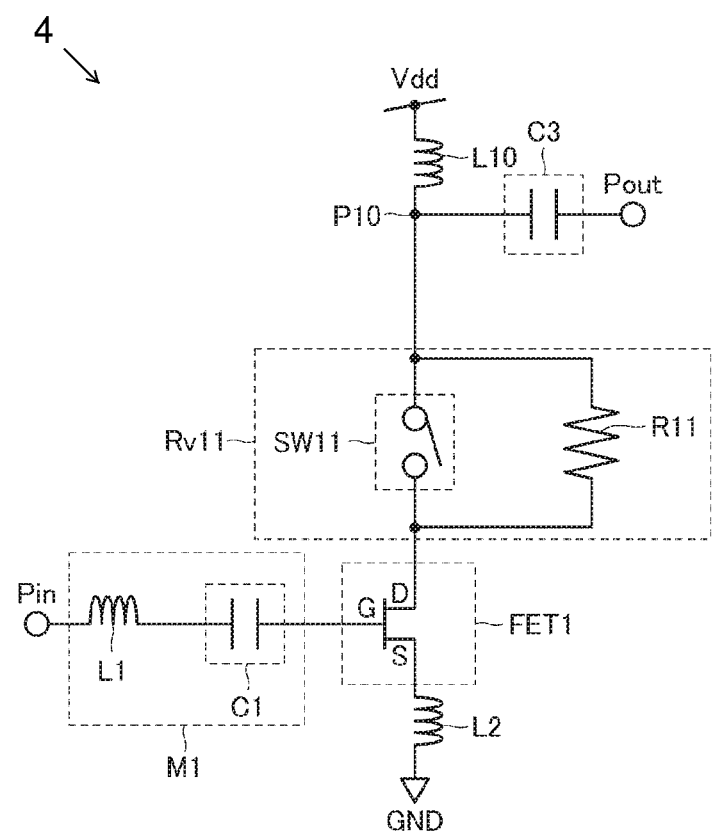
FIG. 13 is a circuit diagram of a low-noise amplifier that is an example of an amplifier according to a fourth embodiment.

FIG. 13 is a circuit diagram of a low-noise amplifier 4 that is an example of an amplifier according to the fourth embodiment. The variable resistance unit Rv11 is connected between the inductor L10 and the drain of the first transistor FET1. The first switch SW11 is connected between the drain of the first transistor FET1 and a node P10 between the inductor L10 and the variable resistance unit Rv11.

As described above, according to the fourth embodiment, the resistance value of a variable resistance unit is made to vary, thereby enabling gain to be controlled so that the gain becomes close to a desired value without necessarily any limitation on a linear area of a transistor.

According to the fourth embodiment, furthermore, the variable resistance unit is implementable by a switch and a resistor. This configuration eliminates the need for a circuit for adjusting the voltage applied to the control terminal of the transistor and can realize a reduction in circuit size. In addition, switching between the closed and open states of the switch enables gain control, which makes it easier to control gain than when the voltage applied to the control terminal of the transistor is controlled.

First Modification of Fourth Embodiment

In the fourth embodiment, reference has been made to the case where the resistance value of a variable resistance unit is made variable in two stages. The number of stages in which the resistance value of a variable resistance unit varies is not limited two and the resistance value of a variable resistance unit may vary in three or more multiple stages. In a first modification of the fourth embodiment, a description will be given of a case where the resistance value of a variable resistance unit is made variable in three or more multiple stages.

The first modification of the fourth embodiment is different from the fourth embodiment in that the resistance value of a variable resistance unit is made variable in three or more stages. That is, in the first modification of the fourth embodiment, the variable resistance unit Rv11 illustrated in FIG. 13 is replaced with a variable resistance unit Rv21 illustrated in FIG. 14. Other configurations are similar and are not described repeatedly herein. The variable resistance unit Rv21 is similar to that in the second embodiment and is not described repeatedly herein.

Figure 14:
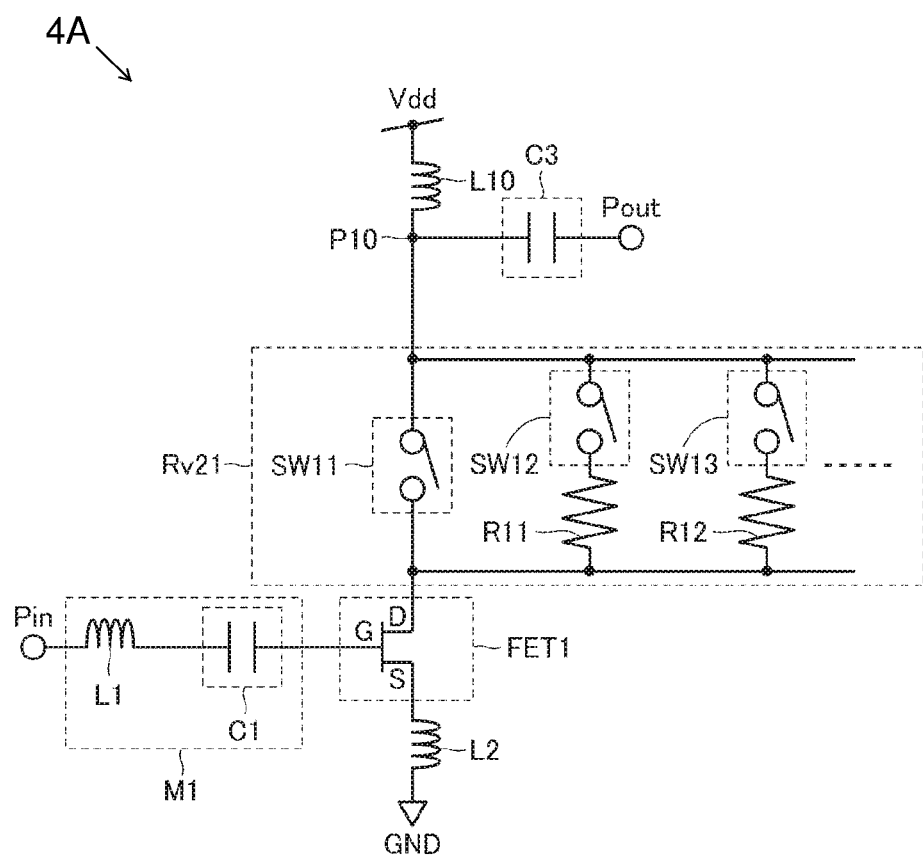
FIG. 14 is a circuit diagram of a low-noise amplifier that is an example of an amplifier according to a first modification of the fourth embodiment.

FIG. 14 is a circuit diagram of a low-noise amplifier 4A that is an example of an amplifier according to the first modification of the fourth embodiment. In the variable resistance unit Rv21, the first switch SW11 is connected between the drain of the first transistor FET1 and the node P10.

As described above, also according to the first modification of the fourth embodiment, the resistance value of a variable resistance unit is made to vary, thereby enabling gain to be controlled so that the gain becomes close to a desired value without necessarily any limitation on a linear area of a transistor. In addition, according to the first modification of the fourth embodiment, the variable resistance unit is implementable by switches and resistors. This configuration eliminates the need for a circuit for adjusting the voltage applied to the control terminal of the transistor and can realize a reduction in circuit size. Additionally, switching between the closed and open states of the switches enables gain control, which makes it easier to control gain than when the voltage applied to the control terminal of the transistor is controlled.

According to the first modification of the fourth embodiment, furthermore, the resistance value of the variable resistance unit can be made to vary in more stages than in the fourth embodiment. Thus, it is possible to adjust gain in finer increments than in the fourth embodiment.

Second Modification of Fourth Embodiment

In the fourth embodiment and the first modification, reference has been made to the case where a transistor included in an amplifier according to an embodiment is a field effect transistor. A transistor included in an amplifier according to an embodiment may be a bipolar transistor. In the following, a description will be given of a second modification of the fourth embodiment in which a transistor included in an amplifier according to an embodiment is a bipolar transistor.

The second modification of the fourth embodiment is different from the fourth embodiment in that a bipolar transistor is used instead of a field effect transistor. That is, in the second modification of the fourth embodiment, the first transistor FET1 illustrated in FIG. 13 is replaced with a first transistor BPT1 illustrated in FIG. 15. Other configurations are similar to those in the fourth embodiment and are not described repeatedly herein. The first transistor BPT1 is similar to that in the third modification of the first embodiment and is not described repeatedly herein.

Figure 15:
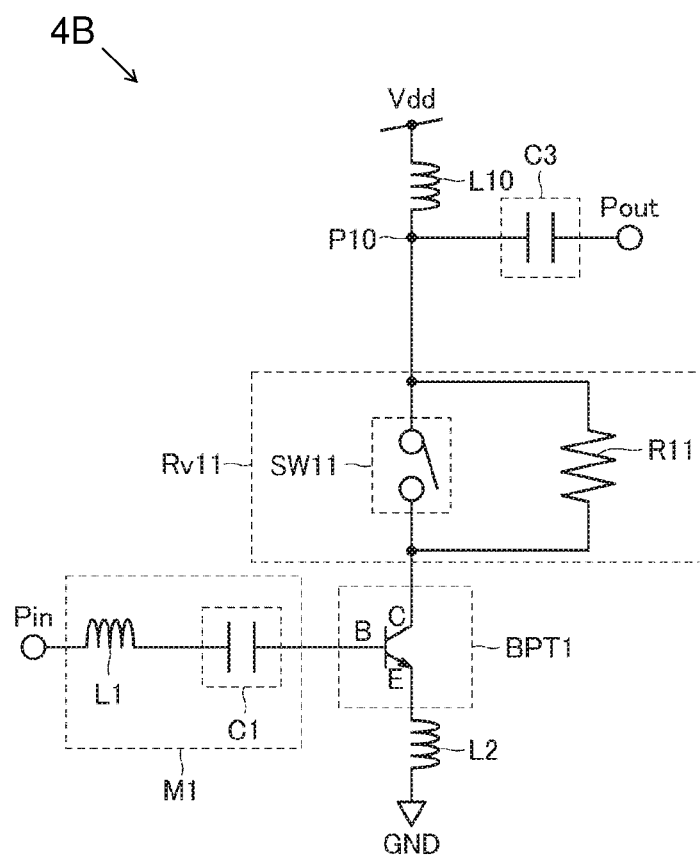
FIG. 15 is a circuit diagram of a low-noise amplifier that is an example of an amplifier according to a second modification of the fourth embodiment.

FIG. 15 is a circuit diagram of a low-noise amplifier 4B that is an example of an amplifier according to the second modification of the fourth embodiment. As illustrated in FIG. 15, in the variable resistance unit Rv11, the first switch SW11 is connected between the collector of the first transistor BPT1 and the node P10.

As described above, also according to the second modification of the fourth embodiment, the resistance value of a variable resistance unit is made to vary, thereby enabling gain to be controlled so that the gain becomes close to a desired value without necessarily any limitation on a linear area of a transistor. In addition, according to the second modification of the fourth embodiment, the variable resistance unit is implementable by a switch and a resistor. This configuration eliminates the need for a circuit for adjusting the voltage applied to the control terminal of the transistor and can realize a reduction in circuit size. Additionally, switching between the closed and open states of the switch enables gain control, which makes it easier to control gain than when the voltage applied to the control terminal of the transistor is controlled.

Fifth Embodiment

Some circuit elements may experience significantly reduced performance by being exposed to noise. For instance, an amplifier may fail to correctly amplify and output an input signal if noise intrudes from the outside. In particular, an amplifier whose gain is made variable may encounter a problem in that a deterioration in noise figure occurs when the signal output level becomes low without necessarily a change in the amount of noise. In a low-noise amplifier that amplifies a received signal with small amplitude, if noise enters, the noise and the received signal are highly indistinguishable from each other.

In a fifth embodiment, accordingly, in order to arrange an amplifier and a noise source as far apart from each other as possible on a semiconductor substrate, an amplifier and a noise source are arranged on a polygonal substrate near the two corners connected by the longest diagonal among the diagonals of the polygonal substrate. With this arrangement, the amplifier and the noise source can be arranged so as to be spaced apart from each other with the longest distance therebetween on the polygonal substrate. This arrangement can therefore reduce noise entering the amplifier, compared with any other arrangement. The fifth embodiment is an important solution to the problem described above for a semiconductor substrate having an amplifier whose gain is variable. In the following, an example in which a low-noise amplifier and an oscillator that is a noise source are arranged so as to be spaced as far as possible from each other on a semiconductor substrate 80 that is a substantially rectangular substrate will be described with reference to FIG. 16. In the fifth embodiment, the term "corner" is used to include not only a portion having an acute angle but also a portion defined by sides, extending in different directions, of the polygonal substrate.

Figure 16:
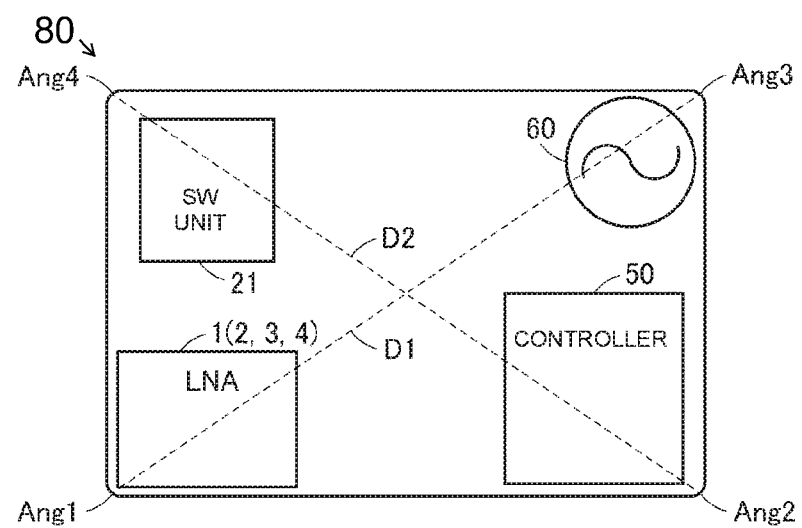
FIG. 16 is a diagram illustrating how a low-noise amplifier and an oscillator are arranged far apart from each other on a substrate in a fifth embodiment.

FIG. 16 is a diagram illustrating how a low-noise amplifier 1 and an oscillator 60 (also including a circuit configuration for repeatedly turning on and off a switch) are arranged so as to be spaced apart from each other on the semiconductor substrate 80. FIG. 16 depicts that the low-noise amplifier 1 and an SW unit 21 included in the front end unit 20 among the functional blocks of the receiving unit 100 illustrated in FIG. 1, the oscillator 60 for generating a voltage (for example, a DC-DC converter), and a controller 50 are defined on the semiconductor substrate 80. The controller 50 is configured to control the low-noise amplifier 1 and the SW unit 21.

As illustrated in FIG. 16, a diagonal D1 connects a corner Ang1 and a corner Ang3. A diagonal D2 connects a corner Ang2 and a corner Ang4. On the semiconductor substrate 80, which is substantially rectangular in shape, the diagonal D1 and the diagonal D2 have substantially the same length. The low-noise amplifier 1 and the oscillator 60 are arranged near the two corners Ang1 and Ang3, which are connected by the diagonal D1, respectively. The distance between the oscillator 60 and the low-noise amplifier 1 is larger than the distance between the oscillator 60 and the SW unit 21 and is larger than the distance between the oscillator 60 and the controller 50. On the semiconductor substrate 80, which is substantially rectangular in shape, the low-noise amplifier 1 and the oscillator 60 are arranged so as to be spaced apart from each other with the longest distance therebetween.

Examples of the noise source, other than an oscillator, include a negative power supply and a charge pump. Examples of the amplifier, other than a low-noise amplifier, include a power amplifier. An amplifier is an exemplary circuit element whose performance is reduced when the circuit element is exposed to noise.

As described above, according to the fifth embodiment, an amplifier and a noise source are arranged near two corners connected by the longest diagonal among the diagonals of a polygonal substrate. With this arrangement, the amplifier and the noise source can be arranged so as to be spaced apart from each other with the longest distance therebetween on the polygonal substrate. This arrangement can therefore reduce noise entering the amplifier, compared with any other arrangement.

The embodiments disclosed herein may be combined as appropriate unless they are mutually exclusive. The embodiments disclosed herein are illustrative only and are not intended to be limiting in any way. The scope of the present invention is defined by the appended claims rather than the foregoing description, and it should be understood that all the changes conceived from the meaning and scope of the claims and their equivalents are included in the scope of the present invention.

While embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An amplifier for amplifying a signal, comprising:
   an input terminal, the signal being input to the input terminal;
   an output terminal, the amplified signal being output from the output terminal;
   a first transistor and a second transistor, the first transistor and the second transistor being connected between ground and a power supply, and each of the first transistor and the second transistor including a control terminal, a first terminal, and a second terminal;
   an impedance element connected between the second terminal of the second transistor and the power supply; and
   a variable resistance element connected between the second terminal of the first transistor and the first terminal of the second transistor, wherein:
   the control terminal of the first transistor is connected to the input terminal,
   the first terminal of the first transistor is connected to the ground,
   the second terminal of the second transistor is connected to the output terminal, and
   the variable resistance element is configured such that a resistance value of the variable resistance element varies in a discrete manner.

2. The amplifier according to claim 1, the amplifier further comprising:
   a first matching circuit connected between the input terminal and the control terminal of the first transistor,
   a second matching circuit connected between the first terminal of the first transistor and the ground, and
   a third matching circuit connected between the second terminal of the second transistor and the output terminal.

3. The amplifier according to claim 2, wherein:
   the first transistor and the second transistor are field effect transistors,
   the control terminal of the first transistor and the control terminal of the second transistor are gates of the first transistor and the second transistor, respectively,
   the first terminal of the first transistor and the first terminal of the second transistor are sources of the first transistor and the second transistor, respectively,
   the second terminal of the first transistor and the second terminal of the second transistor are drains of the first transistor and the second transistor, respectively.

4. The amplifier according to claim 2, wherein:
   the first transistor and the second transistor are bipolar transistors,
   the control terminal of the first transistor and the control terminal of the second transistor are bases of the first transistor and the second transistor, respectively,
   the first terminal of the first transistor and the first terminal of the second transistor are emitters of the first transistor and the second transistor, respectively,
   the second terminal of the first transistor and the second terminal of the second transistor are collectors of the first transistor and the second transistor, respectively.

5. The amplifier according to claim 1, wherein the variable resistance element comprises:
   a first switch connected between the second terminal of the first transistor and the first terminal of the second transistor, and
   a first resistor connected in parallel with the first switch.

6. The amplifier according to claim 1, wherein
   the variable resistance element comprises:
   a first switch connected between the second terminal of the first transistor and the first terminal of the second transistor;
   a first resistor;
   a second switch connected in series with the first resistor;
   a second resistor; and
   a third switch connected in series with the second resistor;
   wherein the first resistor and the second switch are connected in parallel with the first switch, and
   the second resistor and the third switch are connected in parallel with the first switch.

7. The amplifier according to claim 1, wherein a size of the second transistor is larger than a size of the first transistor.

8. The amplifier according to claim 6, further comprising one or more transistors connected between the second terminal of the first transistor and the first terminal of the second transistor,
   wherein a size of a respective transistor successively increases from the first transistor to the second transistor.

9. An amplifier for amplifying a signal, comprising:
   an input terminal, the signal being input to the input terminal;
   an output terminal, the amplified signal being output from the output terminal;
   a transistor connected between a power supply and ground, the transistor including a control terminal, a first terminal, and a second terminal;
   an impedance element connected between the second terminal of the transistor and the power supply; and
   a variable resistance element connected between the impedance element and the second terminal, wherein:
   the control terminal of the transistor is connected to the input terminal,
   the first terminal of the transistor is connected to ground,
   the output terminal is connected to a node between the impedance element and the variable resistance element, and
   the variable resistance element is connected to a wiring of the amplifier that does not connect the power supply to the output terminal, and is configured such that a resistance value of the variable resistance element varies in a discrete manner.

10. The amplifier according to claim 9, wherein the variable resistance element comprises:
a first switch connected between the second terminal and the node, and
a first resistor connected in parallel with the first switch.

11. The amplifier according to claim 9, wherein the variable resistance element comprises:
a first switch connected between the second terminal and the node;
a first resistor;
a second switch connected in series with the first resistor;
a second resistor; and
a third switch connected in series with the second resistor;
wherein the first resistor and the second switch are connected in parallel with the first switch, and the second resistor and the third switch are connected in parallel with the first switch.

12. The amplifier according to claim 9, wherein the transistor is a field effect transistor, the control terminal is a gate, the first terminal is a source, the second terminal is a drain, and the amplifier further comprises:
a first matching circuit connected between the input terminal and the gate,
a second matching circuit connected between the source and the ground, and
a third matching circuit connected between the node and the output terminal.

13. The amplifier according to claim 9, wherein the transistor is a bipolar transistor, the control terminal is a base, the first terminal is an emitter, the second terminal is a collector, and the amplifier further comprises:
a first matching circuit connected between the input terminal and the base,
a second matching circuit connected between the emitter and the ground, and
a third matching circuit connected between the node and the output terminal.

14. The amplifier according to claim 1, wherein the amplifier is a low-noise amplifier, and is provided on a semiconductor substrate with a switch, an oscillator, and a controller.

15. The amplifier according to claim 14, wherein a distance between the oscillator and the low-noise amplifier is larger than a distance between the oscillator and the switch, and is larger than a distance between the oscillator and the controller.

16. The amplifier according to claim 15, wherein the substrate is polygonal, and the low-noise amplifier and the oscillator are arranged near two corners of the polygonal substrate, the two corners being separated by the longest diagonal among all diagonals of the polygonal substrate.

17. A semiconductor device comprising:
a polygonal substrate;
a low-noise amplifier;
a switch;
an oscillator; and
a controller,
wherein a distance between the oscillator and the low-noise amplifier is larger than a distance between the oscillator and the switch, and is larger than a distance between the oscillator and the controller, and
wherein the low-noise amplifier and the oscillator are arranged near two corners of the polygonal substrate, the two corners being separated by the longest diagonal among all diagonals of the polygonal substrate.

18. The amplifier according to claim 5, wherein the first switch is connected in series with both of the second terminal of the first transistor and the first terminal of the second transistor.

19. The amplifier according to claim 10, wherein the first switch is connected in series with both of the second terminal and the node.

* * * * *